United States Patent
Kimes et al.

(10) Patent No.: US 11,360,140 B1
(45) Date of Patent: Jun. 14, 2022

(54) RF FUNCTIONAL PROBE

(71) Applicant: Microsoft Technology Licensing, LLC, Redmond, WA (US)

(72) Inventors: Seth Kimes, Seattle, WA (US); Richard P. Rouse, Seattle, WA (US); Brandon S. Bohlen, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/126,688

(22) Filed: Dec. 18, 2020

(51) Int. Cl.

| | |
|---|---|
| *G01R 33/28* | (2006.01) |
| *G01R 33/30* | (2006.01) |
| *G01R 33/31* | (2006.01) |
| *G01R 33/34* | (2006.01) |
| *G01V 3/00* | (2006.01) |
| *G01R 31/28* | (2006.01) |

(52) U.S. Cl.
CPC ................................ *G01R 31/2822* (2013.01)

(58) Field of Classification Search
CPC .... G01R 33/28; G01R 33/2822; G01R 33/30; G01R 33/31; G01R 33/34; G01R 33/465; G01V 3/00
See application file for complete search history.

(56) References Cited

U.S. PATENT DOCUMENTS

| | | |
|---|---|---|
| 5,131,284 A | 7/1992 | Radziun et al. |
| 5,491,411 A | 2/1996 | Wellstood et al. |
| 6,466,019 B2 | 10/2002 | Marek |
| 7,501,822 B2 * | 3/2009 | Sacher ............... G01R 33/3415 324/318 |
| 8,174,259 B2 | 5/2012 | Hattersley et al. |

(Continued)

FOREIGN PATENT DOCUMENTS

| | | |
|---|---|---|
| CN | 106596671 B | 12/2018 |
| EP | 1486793 A2 | 12/2004 |
| EP | 2095145 A1 | 9/2009 |

(Continued)

OTHER PUBLICATIONS

"International Search Report and Written Opinion Issued in PCT Application No. PCT/US21/058372", dated Mar. 15, 2022, 14 Pages.

(Continued)

*Primary Examiner* — Neel D Shah
(74) *Attorney, Agent, or Firm* — Withrow & Terranova, PLLC

(57) ABSTRACT

The present disclosure relates to a radio frequency (RF) functional probe for testing an RF device in a cryogenic environment. The RF functional probe includes a probe head configured to receive the RF device, a flange structure, an isolation structure coupled between the probe head and the flange structure, and an RF cable structure extending from the flange structure, through the isolation structure, and to the probe head. The isolation structure is configured to provide thermal and electrical isolation to reduce radiant heat leak from the RF cable structure to the RF device. Herein, the isolation structure includes multiple baffle structures, each of which includes cable guides. The cable guides of each baffle structure are configured to guide routing paths for the RF cable structure. The RF cable structure is configured to transmit signals to and from the RF device.

20 Claims, 15 Drawing Sheets

(56) References Cited

U.S. PATENT DOCUMENTS 9,366,736 B2 * 6/2016 Cho .................. G01R 33/307
10,458,834 B2 10/2019 Featonby et al.

FOREIGN PATENT DOCUMENTS

| EP | 2409096 A2 | 1/2012 |
| EP | 3443919 A1 | 2/2019 |
| WO | 2008079204 A1 | 7/2008 |
| WO | 2010106309 A2 | 9/2010 |

OTHER PUBLICATIONS

Fan, et al., "Gaseous /\3He Nuclear Magnetic Resonance Probe for Cryogenic Environments", Retrieved From arXiv:1904.04804v1, Apr. 9, 2019, 8 Pages.

Nicoli, et al., "Quantum dot thermometry at ultra-low temperature in a dilution refrigerator with a 4He immersion cell", In Repository of arXiv: 1909.10906v1, Nov. 13, 2019, 9 Pages.

Lipton, et al., "Low temperature solid-state NMR experiments of half-integer quadrupolar nuclides: caveats and data analysis", In Journal of Magnetic Resonance, vol. 168, Issue 1, May 1, 2004, 9 Pages.

Wire, et al., "A multiple pin, flip-chip system for microwave and gigabit, per second cryogenic device testing at variable temperatures", In Journal of Review of Scientific Instruments, vol. 72, Issue 2, Jan. 30, 2001, 7 Pages.

* cited by examiner

RF FUNCTIONAL PROBE

FIELD OF THE DISCLOSURE

The present disclosure is related to a radio frequency (RF) functional probe for testing RF devices in a cryogenic environment.

BACKGROUND

With the rapid developments of medical technologies and aerospace technologies, radio frequency (RF) applications in cryogenic environments have received more attention than ever before. Therefore, testing/verifying the performance of RF devices accurately and effectively in the cryogenic environments is particularly necessary.

In general, testing and characterization of the RF devices are extremely sensitive to ambient parameters. Temperature variation, magnetic influence, and/or signal stability may affect testing results. Accordingly, it is an object of the present disclosure to provide a testing probe design with improved thermal and electrical isolation and stability, improved signal loss, and improved magnetic shielding. In addition, there is also a need for the probe to accommodate a cryogenic testing chamber to form a sealed/closed environment, which could separate the probe with the RF devices from the atmospheric environment.

SUMMARY

The present disclosure relates to a radio frequency (RF) functional probe for testing an RF device in a cryogenic environment. The RF functional probe includes a probe head configured to receive the RF device, a flange structure, an isolation structure coupled between the probe head and the flange structure, and an RF cable structure extending from the flange structure, through the isolation structure, and to the probe head. The isolation structure is configured to provide thermal and electrical isolation to reduce heat leak from the RF cable structure to the RF device. Herein, the isolation structure includes multiple baffle structures, each of which includes cable guides. The cable guides of each baffle structure are configured to guide routing paths for the RF cable structure. The RF cable structure is configured to transmit signals to and from the RF device.

In one embodiment of the RF functional probe, each baffle structures further includes a baffle with baffle slots and a center baffle hole. The center baffle hole is located at the center of the baffle, while each baffle slot extends from a periphery of the baffle towards the center baffle hole. Herein, each baffle slot is configured to adapt a corresponding cable guide.

In one embodiment of the RF functional probe, the cable guides are formed of Teflon, and the baffle is formed of polished stainless steel.

In one embodiment of the RF functional probe, each cable guide includes multiple separate guide holes that are aligned with a corresponding baffle slot.

In one embodiment of the RF functional probe, the RF cable structure includes multiple RF cable groups, each of which includes multiple RF cable lines. Herein, each RF cable group extends through a corresponding cable guide of each baffle structure. Each RF cable line extends through a corresponding hole of the corresponding cable guide at each baffle structure.

In one embodiment of the RF functional probe, each RF cable group forms a different routing path through the baffle structures.

In one embodiment of the RF functional probe, each baffle structure further includes two baffle holders, which are put on opposite sides of one baffle to hold the baffle in place.

In one embodiment of the RF functional probe, the isolation structure further includes a Teflon isolator, a first G10 isolator, a support rod, and a second G10 isolator. The Teflon isolator is coupled between the probe head and the first G10 isolator. The support rod is coupled between the first G10 isolator and the second G10 isolator, and extends through each baffle structure via the center baffle hole of the baffle. The Teflon isolator, the first G10 isolator, and the second G10 isolator provide thermal and electrical isolation to reduce heat leak from the RF cable structure to the RF device. The support rod is formed of stainless steel.

In one embodiment of the RF functional probe, the isolation structure further includes a shield ring and a shield mount within the shield ring. Herein, the shield mount includes a connection tube and a splitter coupled to the connection tube. The connection tube covers a junction of the Teflon isolator and the first G10 isolator. The splitter includes a plurality of separation arms, which provide structural support to the shield ring and divide inner space of the shield ring into multiple of equal portions.

In one embodiment of the RF functional probe, the RF cable structure includes multiple RF cable groups, each of which includes multiple RF cable lines. Herein, each RF cable group extends from the flange structure, through each baffle structure, through a corresponding portion of the inner space of the shield ring, and toward the probe head.

According to another embodiment, the RF functional probe further includes a magnetic shield. The shield ring is configured to adapt the magnetic shield. The magnetic shield fully covers the probe head, and partially covers the isolation structure.

In one embodiment of the RF functional probe, the shield ring is formed of aluminum, the shield mount is formed of aluminum, and the magnetic shield is formed of mu-metal.

In one embodiment of the RF functional probe, the probe head includes a chuck and a mount stud inserted into the chuck. Herein, a printed circuit board (PCB) is coupled to the chuck and located on an opposite side of the chuck from the mount stud. The chuck is configured to receive the RF device through the PCB. The chuck includes a plurality of chuck notches. The chuck and the mount stud are formed of copper.

In one embodiment of the RF functional probe, the flange structure includes a seal ring, a flange with multiple flange notches, and a flange mount ring. Herein, the seal ring faces the isolation structure and is formed at a periphery of the flange. The flange mount ring faces the isolation structure and is formed at a center of the flange to adapt to the isolation structure.

In one embodiment of the RF functional probe, the chuck and the mount stud are formed of copper, the seal ring is formed of buna or viton, the flange mount ring is formed of aluminum, and the flange is formed of Stainless steel.

In one embodiment of the RF functional probe, the RF cable structure includes multiple RF cable groups, multiple cable connectors, and multiple hermetic RF connectors. Herein, each RF cable group includes multiple RF cable lines. Each cable connector goes through a corresponding chuck notch. Each hermetic RF connector goes through a corresponding flange notch and hermetically seals the corresponding flange notch. Each RF cable group extends from a corresponding hermetic RF connector, through each baffle structure, and to a corresponding cable connector.

In one embodiment of the RF functional probe, the RF cable structure includes multiple RF cable groups, each of which includes multiple RF cable lines. Herein, each RF cable group forms a loop between two adjacent baffle structures so as to absorb cable shrinkage due to temperature changes.

According to another embodiment, the RF functional probe further includes a temperature control structure, which is configured to sense and change temperature of the RF device.

In one embodiment of the RF functional probe, the temperature control structure includes a hermetic DC connector, a temperature sensor, a DC cable group, and a heater. Herein, the hermetic DC connector extends through the flange structure via a flange hole, and a portion of the hermetic DC connector hermetically covers the flange hole. The temperature sensor and the heater are located at the probe head. The temperature sensor is configured to sense the temperature of the RF device, and the heater is configured to change temperature of the RF device. The DC cable group extends from the hermetic DC connector, along the isolation structure, and toward to the temperature sensor and the heater.

According to another embodiment, the RF functional probe further includes a handle structure with a handle and a handle mount bar. Herein, the handle mount bar connects the handle to the flange structure. The handle structure and the isolation structure are located at opposite sides of the flange structure.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1A:
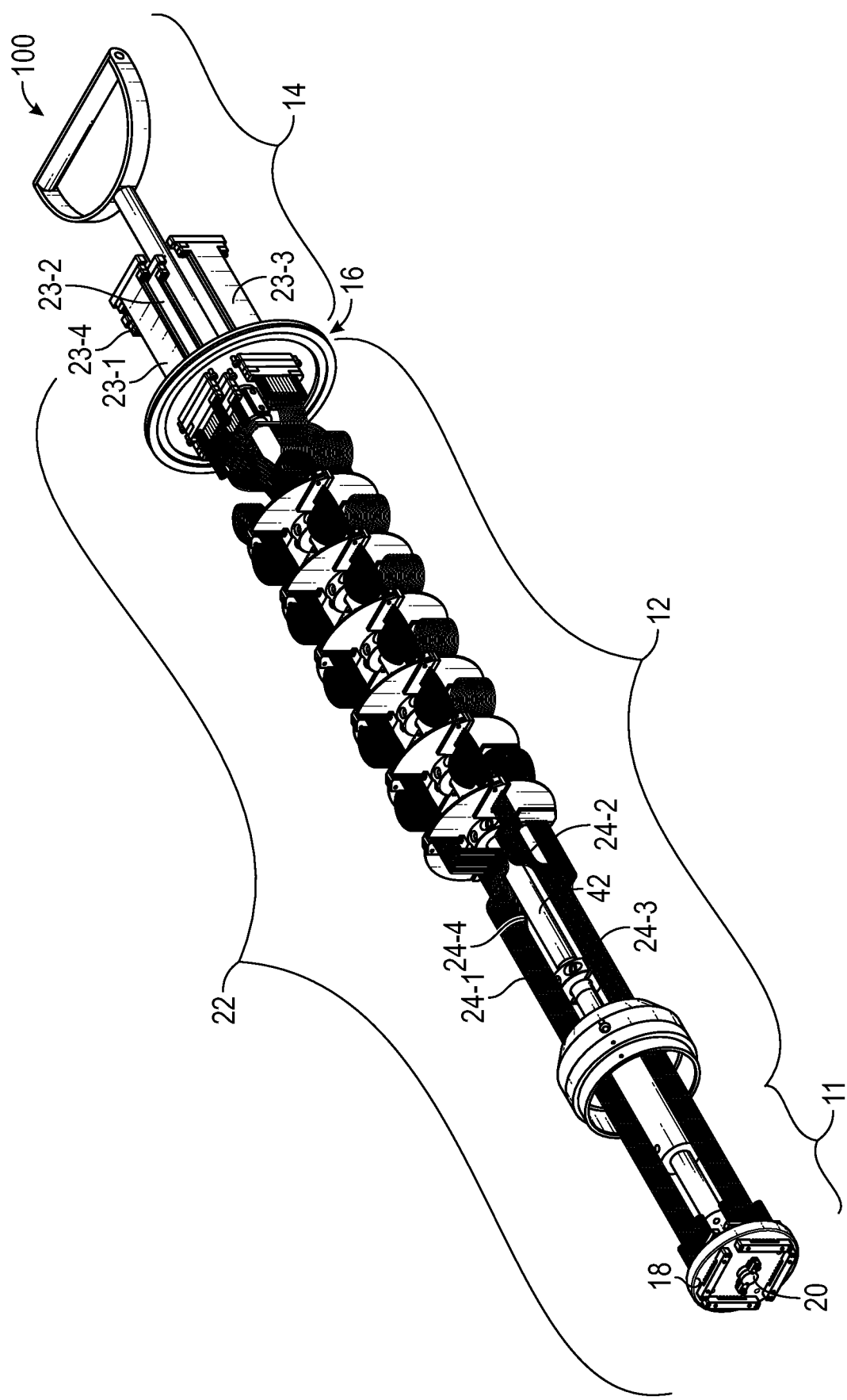
FIGS. 1A-1C show various views of an exemplary radio frequency (RF) functional probe according to one embodiment of the present disclosure.

It will be understood that for clear illustrations, FIGS. 1A-11 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
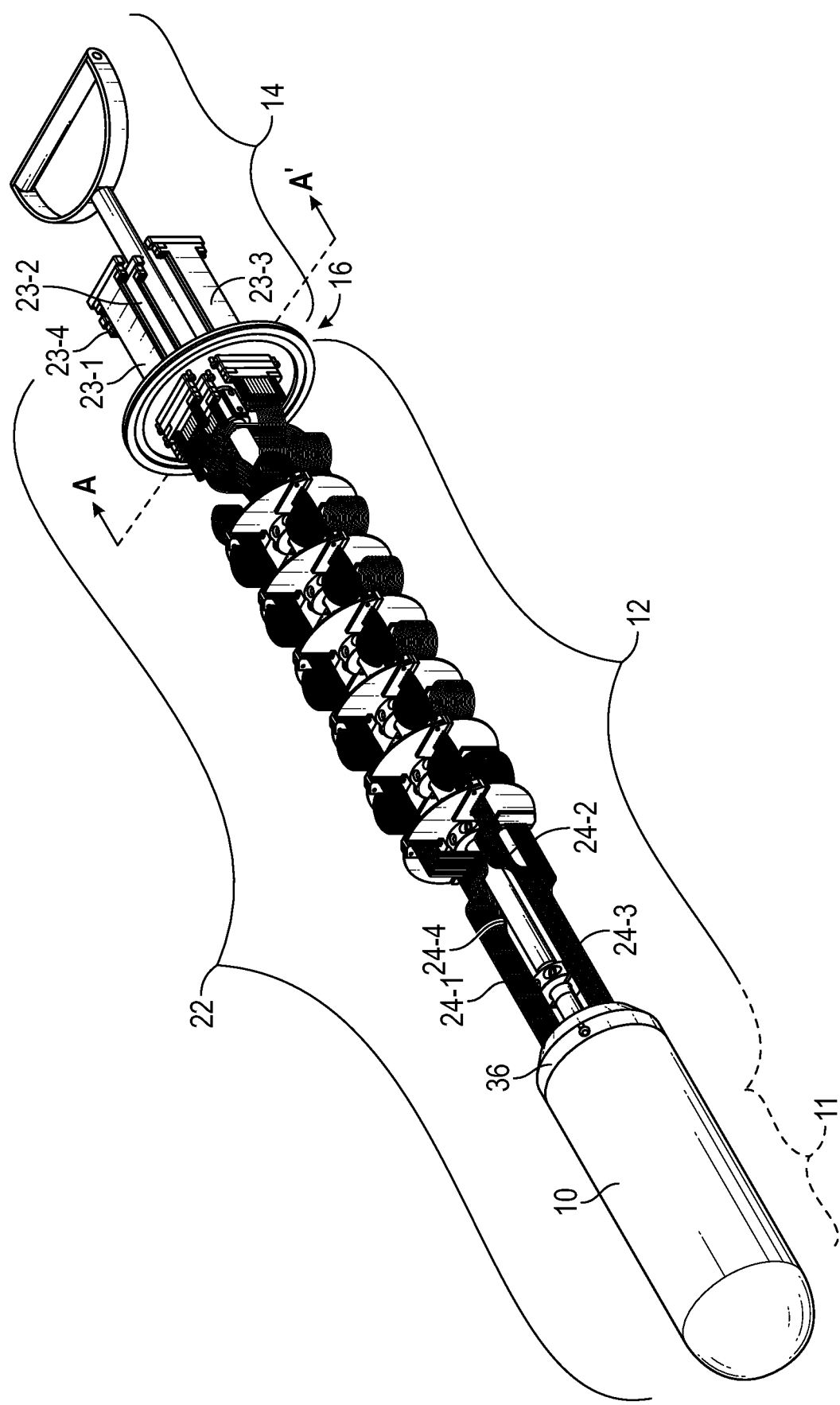
Figure 1C:
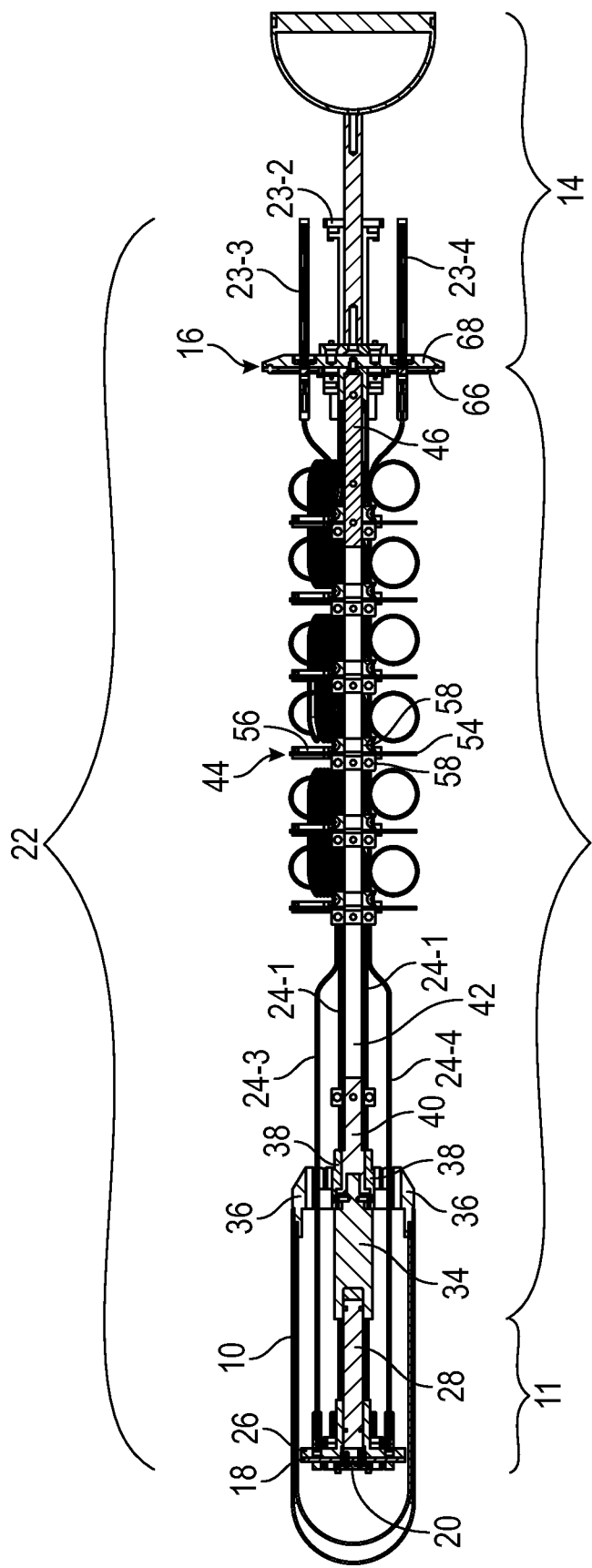

A radio frequency (RF) functional probe is described for RF devices testing in a cryogenic environment, e.g., in a hermetically sealed vacuum environment below 4.2K. FIG. 1A shows an isometric view of an RF functional probe 100 without a magnetic shield, FIG. 1B shows an isometric view of the RF functional probe 100 with a magnetic shield 10, and FIG. 1C shows a cross-section view of the RF functional probe 100 along dashed line A-A' in FIG. 1B (from bottom to top).

In the exemplary embodiment, the RF functional probe 100 includes a probe head 11, an isolation structure 12, a handle structure 14, and a flange structure 16 between the isolation structure 12 and the handle structure 14. Herein, a printed circuit board (PCB) 18 with a to-be-tested RF device 20 is attached to the probe head 11. The magnetic shield 10 fully covers the probe head 11 and partially covers the isolation structure 12. In addition, the RF functional probe 100 also includes an RF cable structure 22 for transmitting signals from/to the RF device 20 (from/to the PCB board 18). The RF cable structure 22 extends through the flange structure 16, along the isolation structure 12, and towards the probe head 11. The isolation structure is configured to provide thermal and electrical isolation to reduce radiant and conductive heat leak from the RF cable structure 22 to the RF device 20 (details are described in the following paragraphs).

For the purpose of this illustration, the RF cable structure 22 includes four hermetic RF connectors 23 (a first hermetic RF connector 23-1, a second hermetic RF connector 23-2, a third hermetic RF connector 23-3, and a fourth hermetic RF connector 23-4), and four RF cable groups 24 (a first RF cable group 24-1, a second RF cable group 24-2, a third RF cable group 24-3, and a fourth RF cable group 24-4), each of which includes multiple RF cable lines. Each hermetic RF connector 23 extends through the flange structure 16 and corresponds to a different RF cable group 24. In different applications, there might be fewer or more hermetic RF connectors 23 and fewer or more RF cable groups 24, respectively, included in the RF cable structure 22 for signal transmission.

Figure 2A:
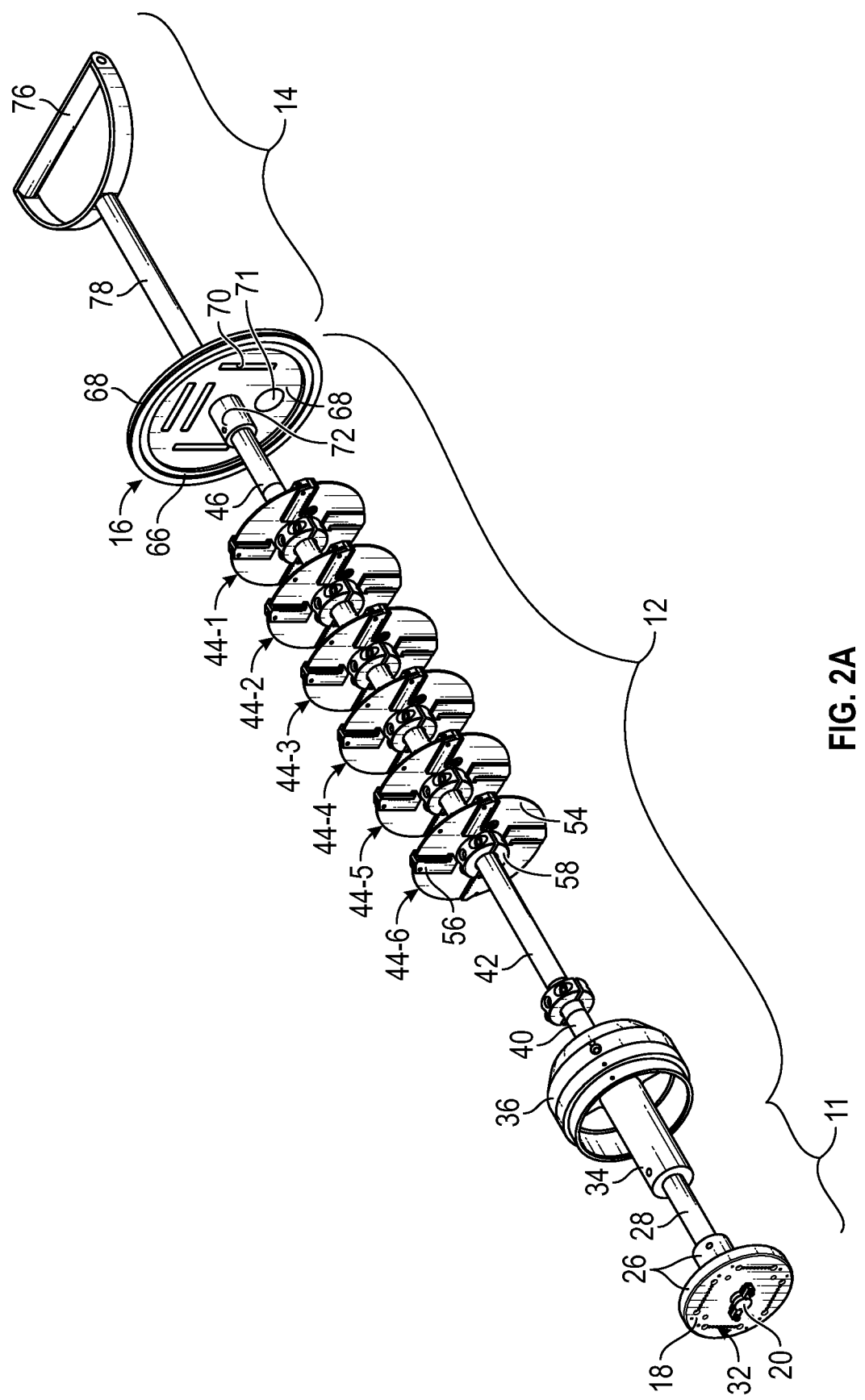
FIGS. 2A-2B show architecture details of the RF functional probe without an RF cable structure and a magnetic shield.
Figure 2B:
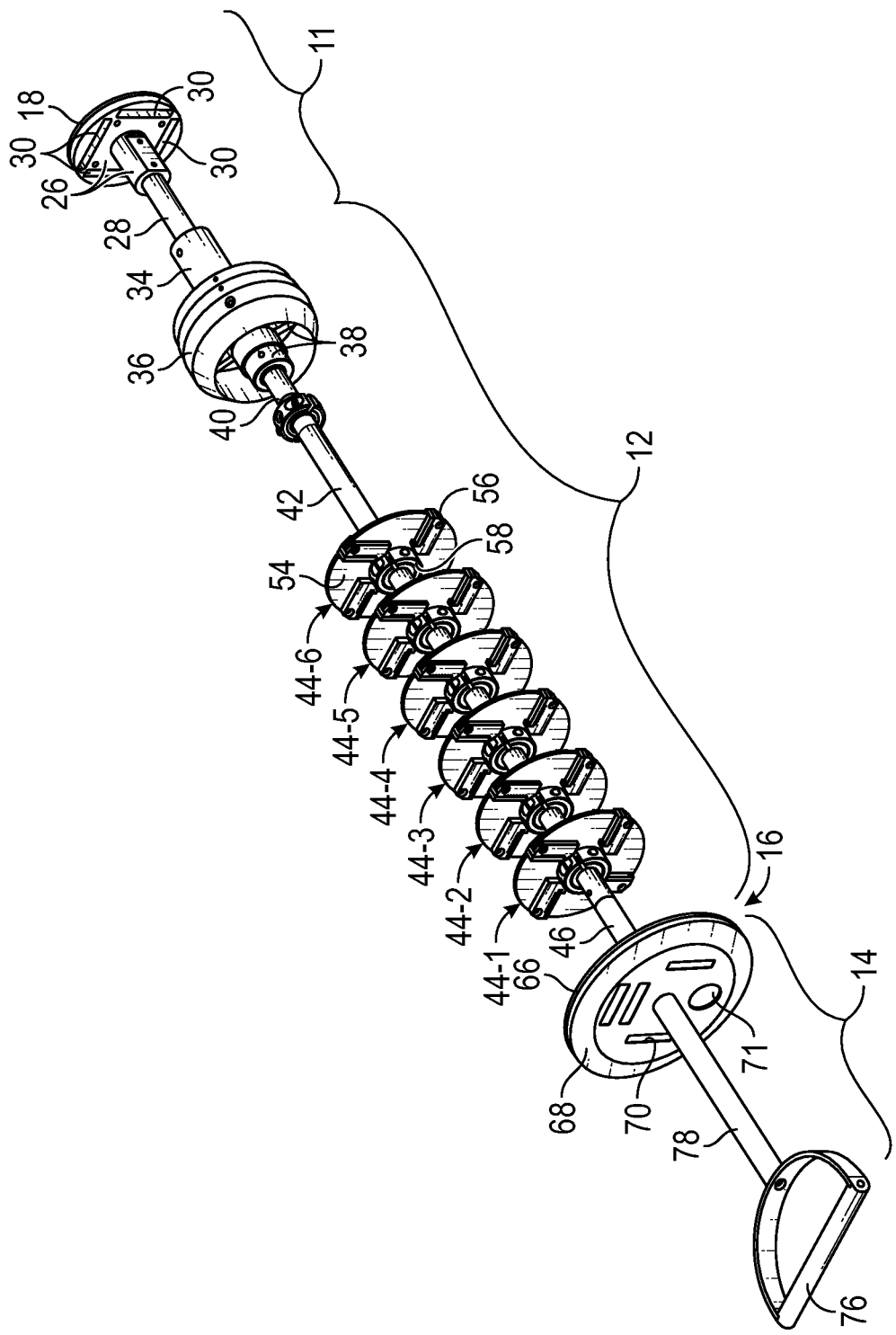
Figure 3:
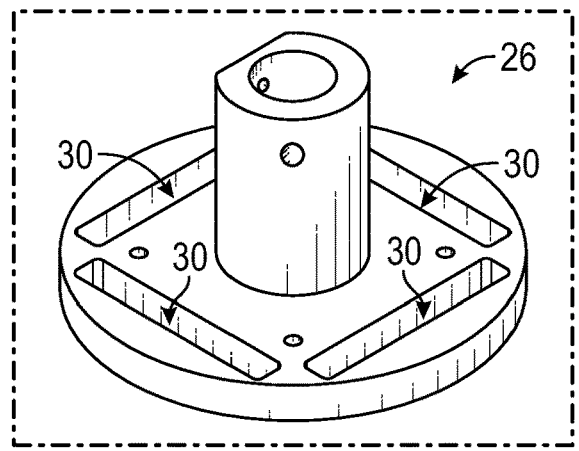
FIG. 3 shows details of a chuck in the RF functional probe.

FIGS. 2A-2B show architecture details of the RF functional probe 100 without the magnetic shield 10 and the RF cable structure 22. In detail, the probe head 11 includes a chuck 26 (zoom-in view as shown in FIG. 3) and a mount stud 28 inserted into the chuck 26. For the purpose of this illustration, the chuck 26 includes four chuck notches 30 formed in a squared layout to accommodate the RF cable structure 22 (details are described in the following paragraphs). The chuck 26 and the mount stud 28 might be formed of copper.

The PCB board 18 is in contact with the chuck 26 and is opposite to the mount stud 28. Herein, the PCB board 18 has four jack sets 32 (only one jack set is labeled with a reference number for clarity), each of which is aligned with a corresponding chuck notch 30 of the chuck 26, respectively. The RF device 20 is mounted at a center of the PCB board 18 and into the chuck 26. Note that the PCB board 18 is not permanently attached to the chuck 26 and the RF device 20 is not permanently mounted to the PCB board 18. It is easy to replace the existing PCB board 18 with another PCB board and/or replace the existing RF device 20 with another RF device that needs to be tested.

In different applications, if the RF cable structure 22 includes fewer or more RF cable groups, the chuck 26 will have fewer or more chuck notches 30 accordingly and the PCB board 18 will have fewer or more jack sets 32 accordingly. In addition, the chuck 26 may have different layouts of the chuck notch 30 and the PCB board 18 may have different layouts of the jack sets 32 to accommodate different RF cable structures. The RF device 20 might be mounted to a different portion of the PCB board 18.

The isolation structure 12 includes a Teflon isolator 34 (formed of Teflon), a shield ring 36, a shield mount 38 within the shield ring 36, a first G10 isolator 40 (formed of a G10 material), a support rod 42, multiple baffle structures 44 (a first baffle structure 44-1, a second baffle structure 44-2, a third baffle structure 44-3, a fourth baffle structure 44-4, a fifth baffle structure 44-5, and a sixth baffle structure 44-6), and a second G10 isolator 46 (formed of a G10 material). The Teflon isolator 34, the first G10 isolator 40, the baffle structures 44, and the second G10 isolator 46 are configured to provide thermal and electrical isolation to reduce heat leak (from the flange structure 16, the RF cable structure 22, and/or the isolation structure 12 itself) to the RF device 20 to be tested. Therefore, reliable and rapid (in seconds) temperature change, e.g., between room temperature and 4.2K cryogenic temperature, can be achieved for the RF device 20.

The mount stud 28 of the probe head 11 is inserted into a first side of the Teflon isolator 34 (cross-section view as shown in FIG. 1C). A protrusion at a second side of the Teflon isolator 34, opposite to the first side of the Teflon isolator 34, is inserted into the first G10 isolator 40 (cross section view as shown in FIG. 1C).

Figure 4A:
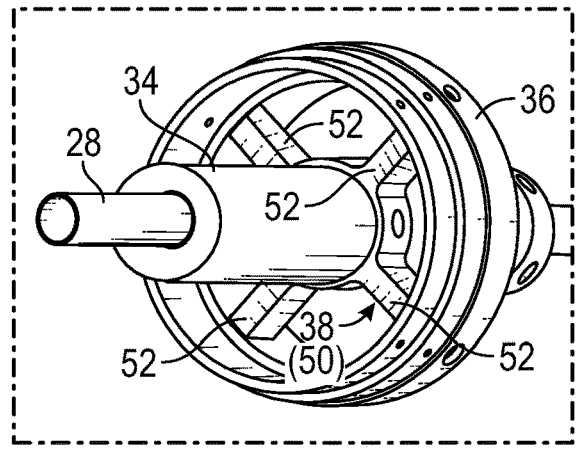
FIGS. 4A-4B show details of a shield ring and a shield mount in the RF functional probe.
Figure 4B:
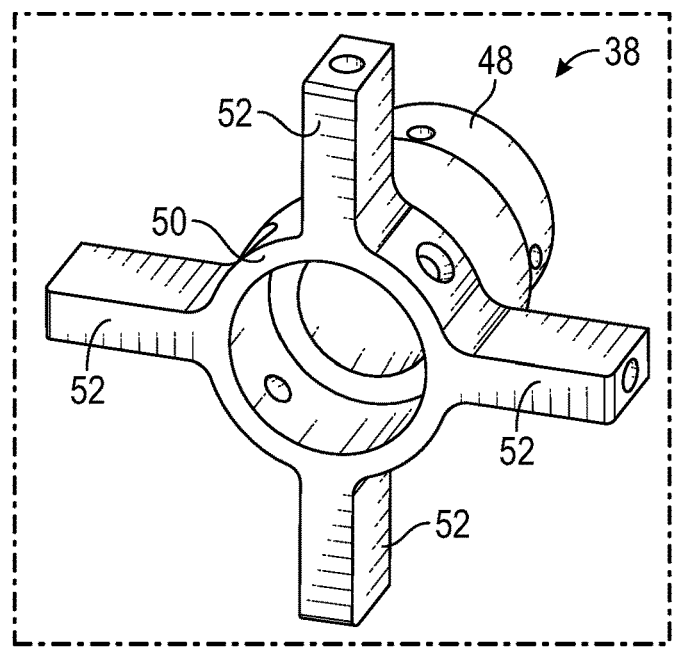

FIGS. 4A and 4B illustrate details of the shield ring 36 and the shield mount 38. The shield ring 36 is configured to adapt the magnetic shield 10 (as shown in FIG. 1B). The shield mount 38 includes a connection tube 48 and a splitter 50 coupled to the connection tube 48. For the purpose of this illustration, the splitter 50 has four separation arms 52, which are orthogonal to each other. Herein, the separation arms 52 of the splitter 50 provide structural support to the shield ring 36 and the magnetic shield 10, and also divide the inner space of the shield ring 36 into four equal portions. Therefore, each RF cable group 24 of the RF cable structure 22 could extend through a corresponding portion of the inner space of the shield ring 36, respectively (details are described in the following paragraphs). In different applications, if the RF cable structure 22 includes fewer or more RF cable groups, the splitter 50 of the shield mount 38 will include fewer or more separation arms 52. The splitter 50 is configured to enable each RF cable group 24 extending through a separate inner portion of the shield ring 36. In addition, the junction of the Teflon isolator 34 and the first G10 isolator 40 may be covered by the connection tube 48 of the shield mount 38. The shield ring may be formed of aluminum, the shield mount may be formed of aluminum, and the magnetic shield may be formed of mu-metal.

The support rod 42 might be a hollow rod and formed of stainless steel. In one exemplary embodiment, the support rod 42 is formed between the first G10 isolator 40 and the second G10 isolator 46, and extends through the second to sixth baffle structures 44-2-44-6. The second G10 isolator 46 extends from the flange structure 16, through the first baffle structure 44-1 and inserts into the support rod 42.

Figure 5A:
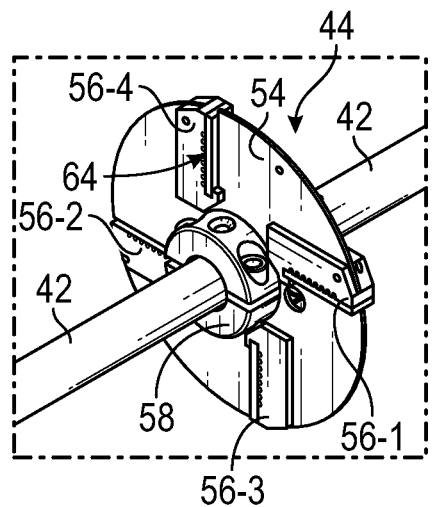
FIGS. 5A-5C show details of a baffle structure in the RF functional probe.
Figure 5B:
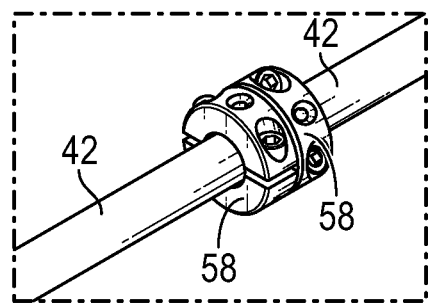
Figure 5C:
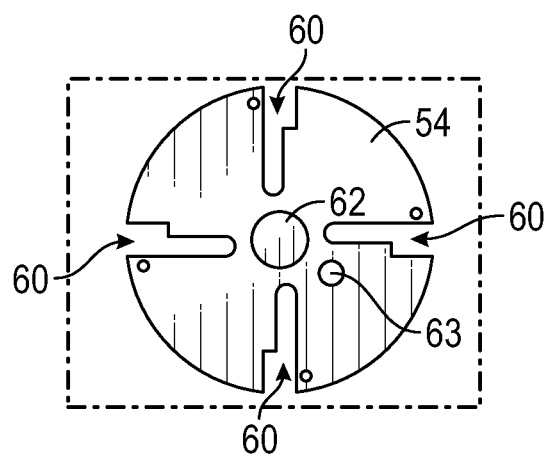

FIGS. 5A-5C show details of one baffle structure 44. Each baffle structure 44 includes a baffle 54, four cable guides 56 (including a first cable guide 56-1, a second cable guide 56-2, a third cable guide 56-3, and a fourth cable guide 56-4), and two baffle holders 58. Herein, the baffle 54 may be formed of polished stainless steel, and the cable guides 56 may be formed of Teflon. Each baffle structure 44, especially the baffle 54, is configured to limit radiant heat transmitting from the RF cable structure 22 to the probe head 11.

For the purpose of this illustration, the baffle 54 includes four baffle slots 60 to adapt the four cable guides 56, a center baffle hole 62 to adapt the support rod 42, and a side baffle hole 63 to route a DC cable group (not shown herein, details are described in the following paragraphs). Each baffle slot 60 extends from the periphery of the baffle 54 towards the center baffle hole 62 and is orthogonal to another. Each cable guide 56 includes multiple guide holes 64 (only one guide hole is labeled with a reference number for clarity) to guide a corresponding RF cable group 24 to route through the baffle structure 44 (via a corresponding baffle slot 60 of the baffle 54). The size of each guide hole 64 is designed on the diameter size of one RF cable line of the RF cable group 24 (details are described in the following paragraphs). In different applications, if the RF cable structure 22 includes fewer or more RF cable groups 24, the baffle 54 will include fewer or more baffle slots 60 and the baffle structure 44 will include fewer or more cable guides 56 accordingly. In addition, the cable guides 56 and the baffle slots 60 may have different layouts. The two baffle holders 58 are put on opposite sides of one baffle 54 (through the support rod 42) to hold the baffle 54 in place.

The flange structure 16 includes a seal ring 66, a flange 68 with four flange notches 70 (only one flange notch is labeled with a reference number for clarity) and a flange hole 71, and a flange mount ring 72. The seal ring 66 faces the baffle structures 44 and is formed at the periphery of a first surface of the flange 68. The flange 68 with the seal ring 66 is configured to seal the probe head 10 with the RF device 20, the isolation structure 12, and major portions of the RF cable structure 22 in a cryogenic environment (details are described in the following paragraphs). In different applications, if the RF cable structure 22 includes fewer or more hermetic RF connectors 23 (fewer or more RF cable groups 24), the flange 68 will include fewer or more flange notches 70 accordingly. Also, the flange notches 70 may have different layouts. The flange hole 71 is configured to hold a hermetic direct-current (DC) connector (not shown herein, details are described in the following paragraphs). The four flange notches 70 and the flange hole on the flange 68 are exposed through the seal ring 66. The flange mount ring 72 is mounted at a center of the first surface of the flange 68 and is configured to hold the second G10 isolator 46. The seal ring 66 may be formed of buna or viton, the flange 68 may be formed of stainless steel, and the flange mount ring 72 may be formed of aluminum. In one exemplary embodiment, the RF device 20 is about 28 inches (with −/+5% margin) away from the flange structure 16. In addition, the handle structure 14 includes a handle 76 and a handle mount bar 78 connecting the handle 76 to a second surface of the flange 68, which is opposite to the first surface of the flange 68.

Figure 6A:
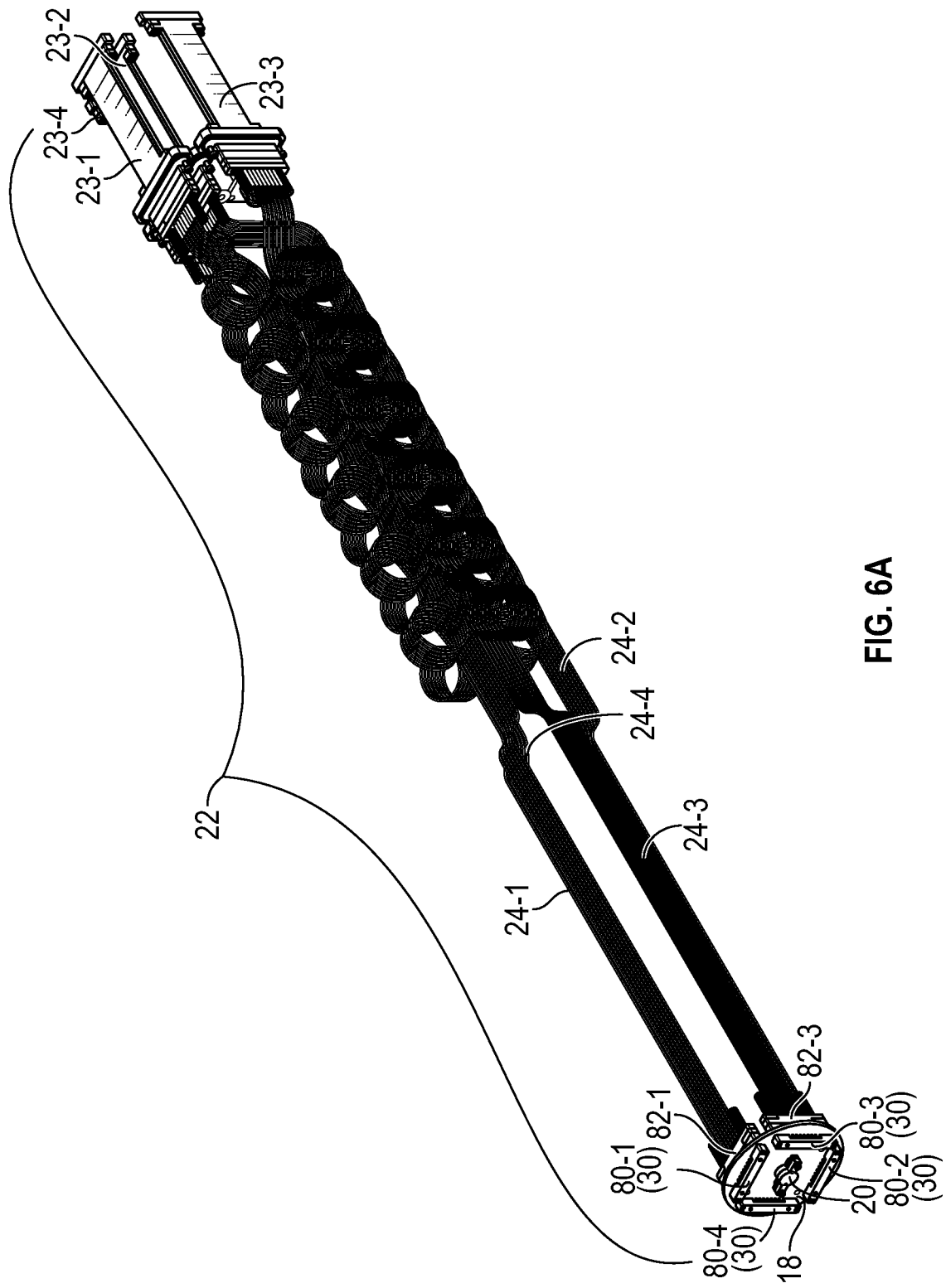
FIGS. 6A-6B show details of the RF cable structure in the RF functional probe.
Figure 6B:
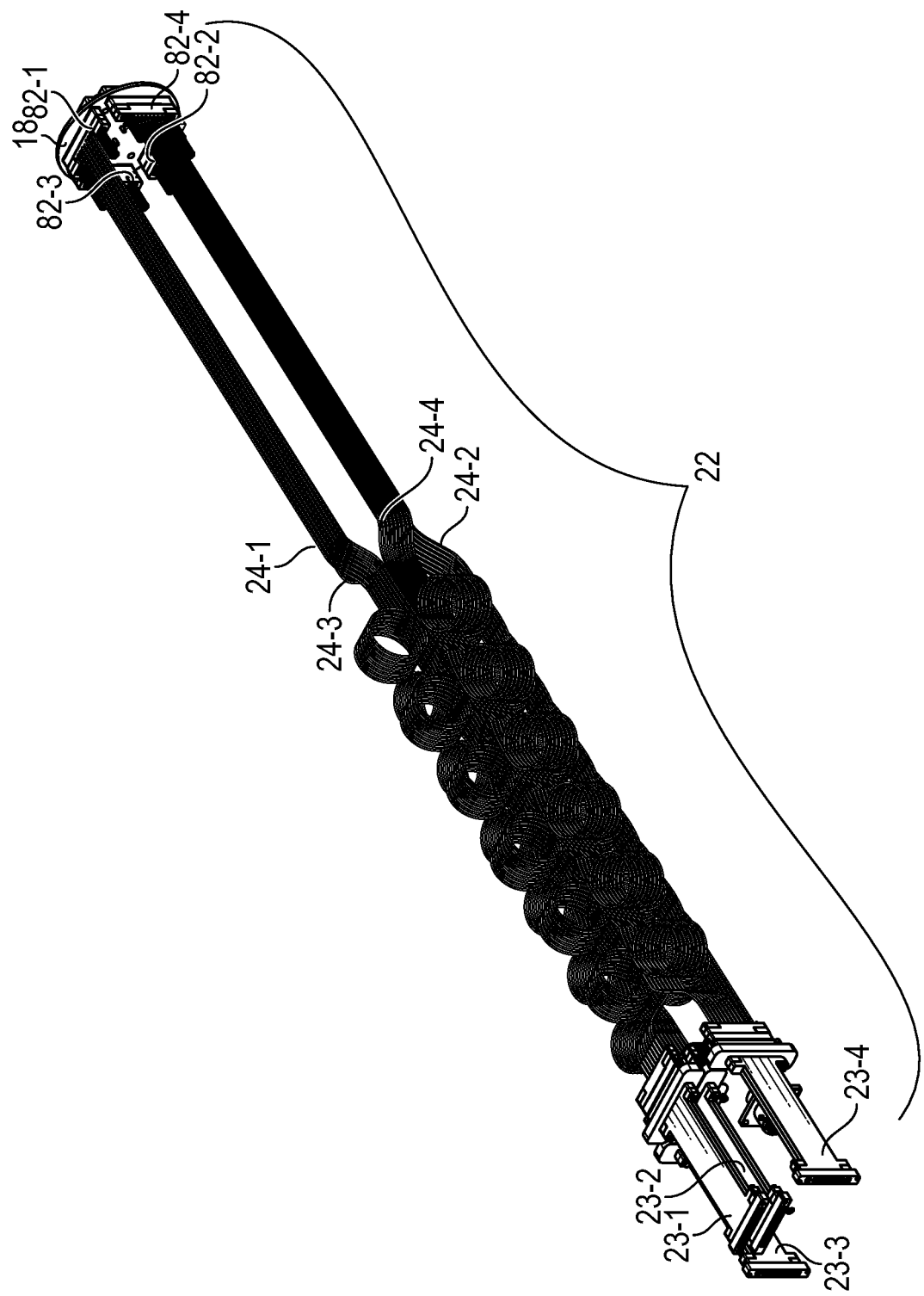

FIGS. 6A and 6B show details of the RF cable structure 22. In one exemplary embodiment, each RF cable group 24 has eight RF cable lines, and each RF cable line might have a 0.034 inch diameter. Each RF cable line may be formed from three portions (not shown): an inner portion formed of a first conductive material (such as copper or copper nickel), an intermediate portion formed of Teflon, and an outer portion, which is for RF shielding, formed of a second conductive material (such as copper or copper nickel). In different applications, each RF cable group may have fewer or more RF cable lines, and each RF cable line may have a smaller or larger diameter size.

Besides the four hermetic RF connectors 23 and the four RF cable groups 24, the RF cable structure 22 also includes four cable holders 80 (a first cable holder 80-1, a second cable holder 80-2, a third cable holder 80-3, and a fourth cable holder 80-4), and four cable connectors 82 (a first cable connector 82-1, a second cable connector 82-2, a third cable connector 82-3, and a fourth cable connector 82-4). Each RF cable group 24, a corresponding cable holder 80, a corresponding cable connector 82, and a corresponding hermetic RF connector 23 form one cable assembly, which has a high density of cabling. Herein, the high density of cabling refers to numerous compact RF connections in a small footprint to limit the diameter of the probe to reduce the heat and radiation load. The high density of cabling leads to high density RF capacity and low signal loss at GHz frequency. Both the cable connectors 82 and the hermetic RF connectors 23 are spring loaded so as to compensate some cable shrinkage due to the temperature change, e.g., between the room temperature and the cryogenic temperature 4.2K. As such, the cable assembly can be kept in place and will be reliable. In different applications, there might be fewer or more numbers of RF cable groups 24 included in the RF cable structure 22, and in consequence, there will be fewer or more cable holders 80, cable connectors 82, and hermetic RF connectors 23, accordingly.

In one exemplary embodiment, a first side of the first RF cable group 24-1 is attached to the first cable connector 82-1 that is electrically connected to the PCB board 16 and the first cable holder 80-1, while a second side of the first RF cable group 24-1 is attached to the first hermetic RF connector 23-1 that extends through the flange structure 16. A same connection configuration is applied to each of the second RF cable group 24-2, the third RF cable group 24-3, and the fourth RF cable group 24-4. Each RF cable group 24 extends continuously from the corresponding cable connector 82 to the corresponding hermetic RF connector 23. Herein, the four cable holders 80 and the RF device 20 are located at a same side of the PCB board 18, while the four cable connectors 82 and the RF device 20 are located at opposite sides of the PCB board 18. The cable holders 80 might be sockets or solder structures attached to the PCB board 18.

The first RF cable group 24-1, the second RF cable group 24-2, the third RF cable group 24-3, and the fourth RF cable group 24-4 may have different routing paths so as to reduce electrical interference with each other, and consequently, to reduce or eliminate thermal addition from the electrical interference. In each routing path of the RF cable group 24, there might be multiple loops formed to absorb cable shrinkage due to the temperature change, e.g., between the room temperature and the cryogenic temperature below 4.2K.

Figure 7A:
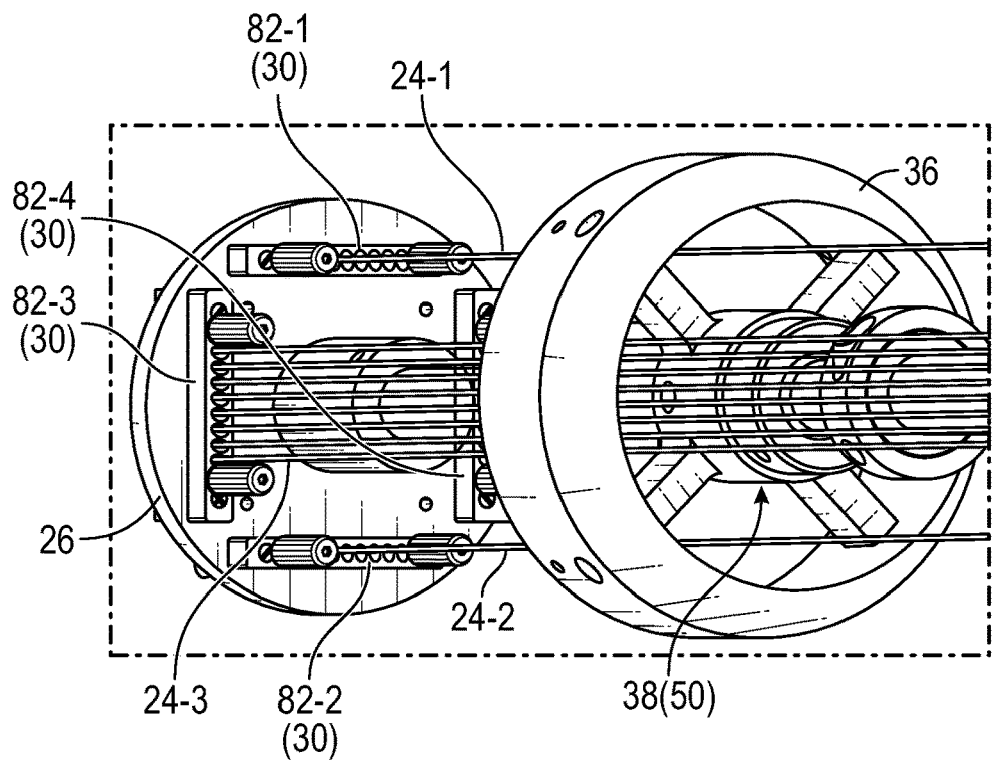
FIGS. 7A and 7B show routing details of the RF cable structure through the shield ring and connection details of the RF cable structure at a probe head in the RF functional probe.
Figure 7B:
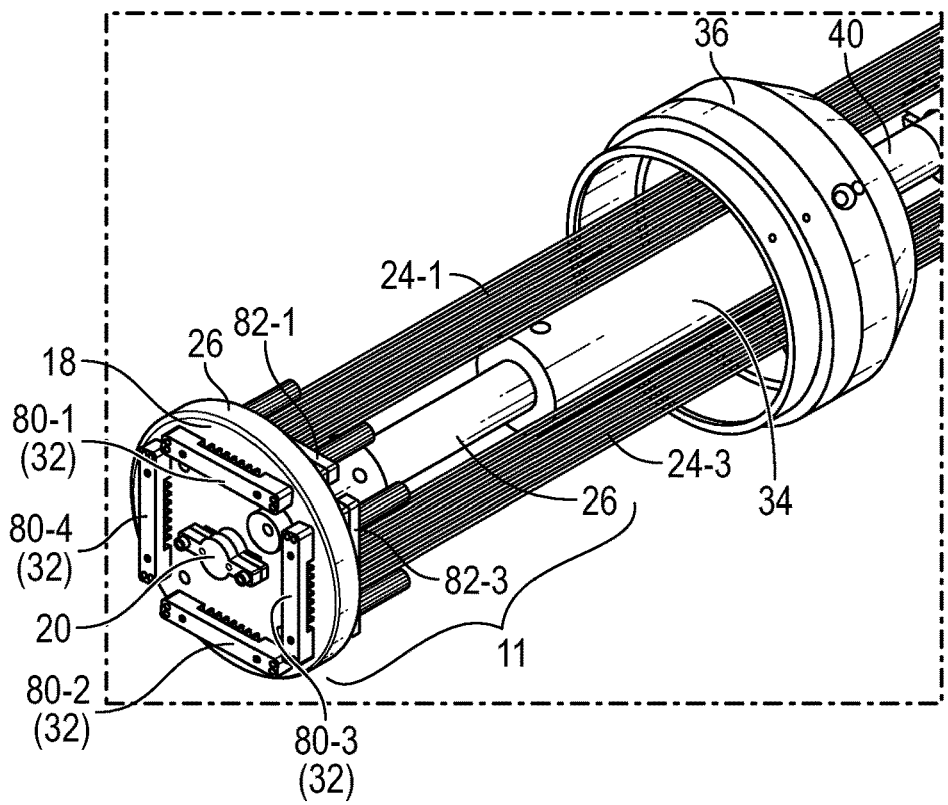

FIGS. 7A and 7B illustrate how the RF cable structure 22 extends through the shield ring 36 and illustrate connection details of the RF cable structure 22 at the probe head 11. Recall that the splitter 50 of the shield mount 38 divides the inner space of the shield ring 36 into four equal portions, each RF cable group 24 of the RF cable structure 22 extends through the shield ring 36 separately via a corresponding inner space portion of the shield ring 36. The separation of the RF cable groups 24 will have reduced electrical interference and reduced thermal effect to each RF cable group 24 due to the reduced electrical interference.

The first side of the first RF cable group 24-1 is attached to the first cable connector 82-1 that goes through a corresponding chuck notch 30 on the chuck 26, though a corresponding jack set 32 on the PCB board 18, and into the first cable holder 80-1. As such, the first RF cable group 24-1 is electrically connected to the PCB board 18, and of course, the RF device 20, via the first cable connector 82-1 and the first cable holder 80-1. Similarly, the second RF cable group 24-2, the second RF cable group 24-3, and the fourth RF cable group 24-4 are electrically connected to the PCB board 18 and the RF device 20. In addition, the connection between each cable holder 80 and the corresponding cable connector 82 enables the PCB board 18 attached to the chuck 26 and keeps each RF cable group 24 in place.

Figure 8A:
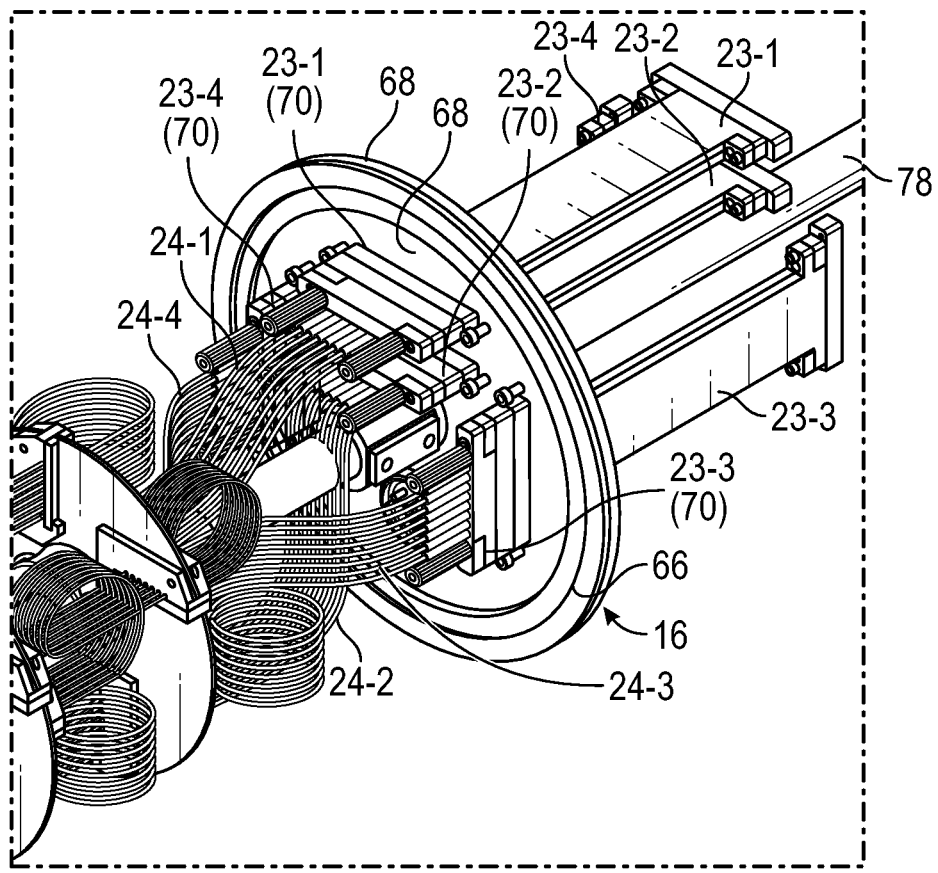
FIGS. 8A and 8B show connection details of the RF cable structure at a flange structure in the RF functional probe.
Figure 8B:
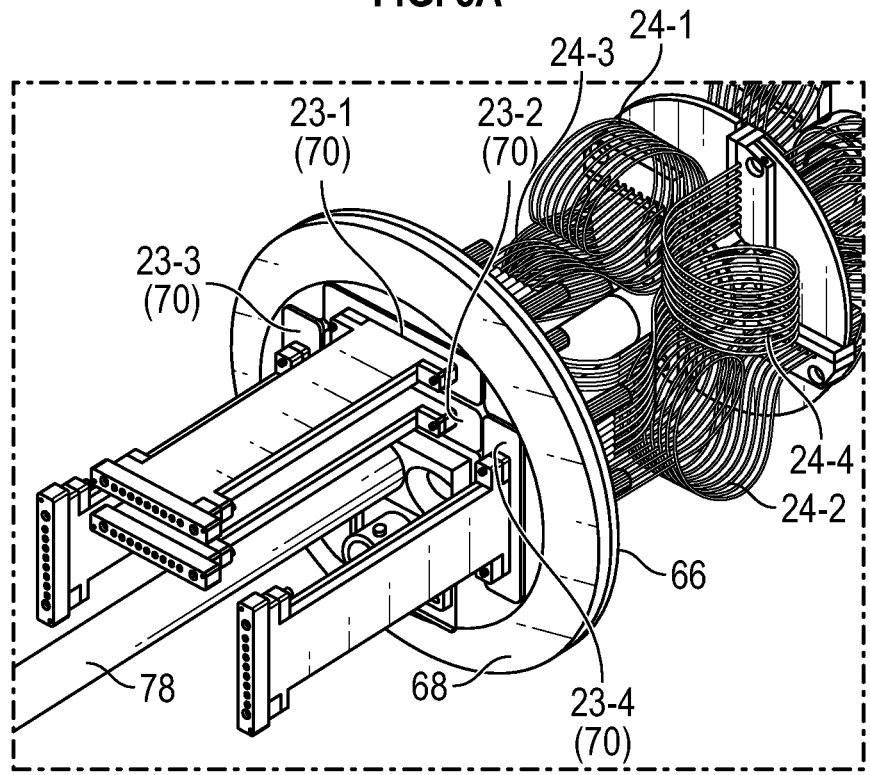

FIGS. 8A and 8B illustrate connection details of the RF cable structure 22 at the flange structure 16. The second side of the first RF cable group 24-1 is connected to the first hermetic RF connector 23-1, which extends through a corresponding flange notch 70 on the flange 68. Similarly, the second RF cable group 24-2 is connected to the second hermetic RF connector 23-1, which extends through a corresponding flange notch 70 on the flange 68. The third RF cable group 24-3 is connected to the third hermetic RF connector 23-3, which extends through a corresponding flange notch 70 on the flange 68. The fourth RF cable group 24-4 is connected to the fourth hermetic RF connector 23-4, which extends through a corresponding flange notch 70 on the flange 68. As such, signals can be transmitted from the hermetic RF connectors 23, through the RF cable groups 24, to the RF device 20. Herein, a portion of the first hermetic RF connector 23-1, a portion of the second hermetic RF connector 23-2, a portion of the third hermetic RF connector 23-3, and a portion of the fourth hermetic RF connector 23-4 hermetically cover the corresponding flange notches 70, respectively.

Figure 9:
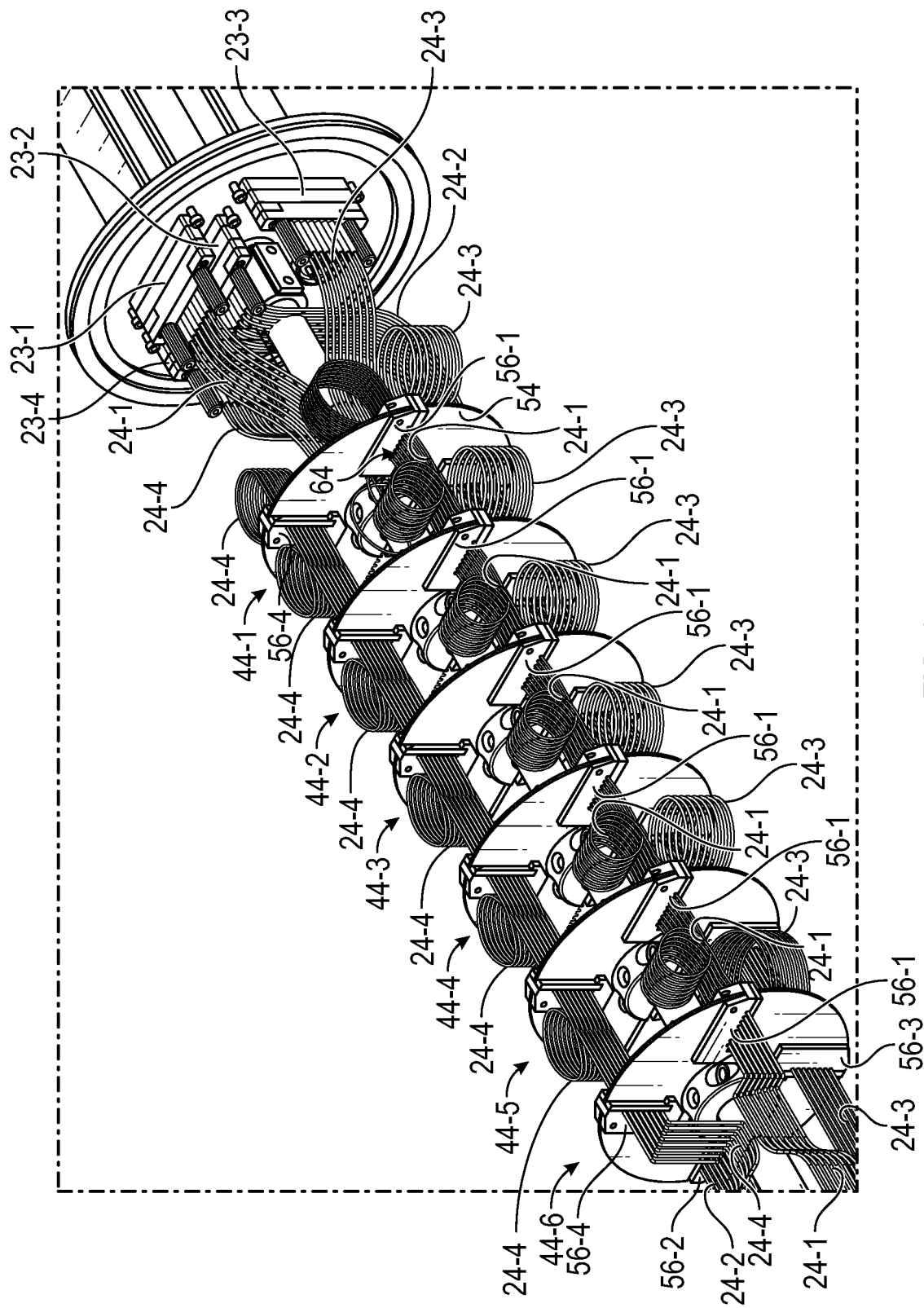
FIG. 9 shows routing details of the RF cable structure through the baffle structures in the RF functional probe.

FIG. 9 illustrates routing details of the RF cable structure 22 through the baffle structures 44. Each RF cable group 24 extends from a corresponding hermetic RF connector 23 and through six baffle structures 44 in a different routing path. In different applications, there might be fewer or more baffle structures 44 included in the isolation structure 12.

The first RF cable group 24-1 extends from the first hermetic RF connector 23-1, forms a first loop before the first baffle structure 44-1, extends through the first baffle structure 44-1 via the guide holes 64 (one guide hole 64 for a corresponding cable, only one guide hole is labeled with a reference number for clarity) at the first cable guide 56-1 (through a corresponding baffle slot 60 of the baffle 54), forms a second loop between the first baffle structure 44-1 and the second baffle structure 44-2, extends through the second baffle structure 44-2 via the guide holes 64 (one guide hole 64 for a corresponding cable) at the first cable guide 56-1 (through the corresponding baffle slot 60 of the baffle 54), forms a third loop between the second baffle structure 44-2 and the third baffle structure 44-3, extends through the third baffle structure 44-3 via the guide holes 64 (one guide hole 64 for a corresponding cable) at the first cable guide 56-1 (through the corresponding baffle slot 60 of the baffle 54), forms a fourth loop between the third baffle structure 44-3 and the fourth baffle structure 44-4, extends through the fourth baffle structure 44-4 via the guide holes 64 (one guide hole 64 for a corresponding cable) at the first cable guide 56-1 (through the corresponding baffle slot 60 of the baffle 54), forms a fifth loop between the fourth baffle structure 44-4 and the fifth baffle structure 44-5, extends through the fifth baffle structure 44-5 via the guide holes 64 (one guide hole 64 for a corresponding cable) at the first cable guide 56-1 (through a corresponding baffle slot 60 of the baffle 54), forms a sixth loop between the fifth baffle structure 44-5 and the sixth baffle structure 44-6, and extends through the sixth baffle structure 44-6 via the guide holes 64 (one guide hole 64 for a corresponding cable) at the first cable guide 56-1 (through the corresponding baffle slot 60 of the baffle 54).

The loops formed between adjacent baffle structures 44 are configured to absorb cable shrinkage due to the temperature changes, e.g., between the room temperature and the cryogenic temperature (like below 4.2K). As such, the cable connectors 82 and the hermetic RF connectors 23 can be kept in place to provide good cable connection for the RF device 20. In addition, these loops provide enough cable material for each thermal stage (between adjacent two baffle structures 44) to maximize thermal gradient of each RF cable line to reduce heat leak. Herein, the guide holes 64 of the first cable guide 56-1 of each baffle structure 44 are configured to electrically isolate the RF cable lines from each other within the first RF cable group 24-1. Furthermore, the guide holes 64 of the first cable guide 56-1 of each baffle structure 44 is also configured to hold each RF cable line of the first RF cable group 24-1 in a fixed place relative to a plane of each baffle 54, when the RF cable lines of the first RF cable group 24-1 slide through the baffle structures 44 during thermal expansion and contraction.

Similarly, each of the second RF cable group 24-2, the third RF cable group 24-3, and the fourth RF cable group 24-4 forms six loops along the six baffle structures 44, and extends through the baffle structures 44 via the guide holes 64 of a correspond cable guide 56. Each cable guide 56 provides electrical isolation of the RF cable lines within one RF cable group and provides avoidance from movement relative to a plane of each baffle 54 during thermal expansion and contraction. Notice that there are no magnetic components from the support rod 42 down to the RF device 20.

Figure 10A:
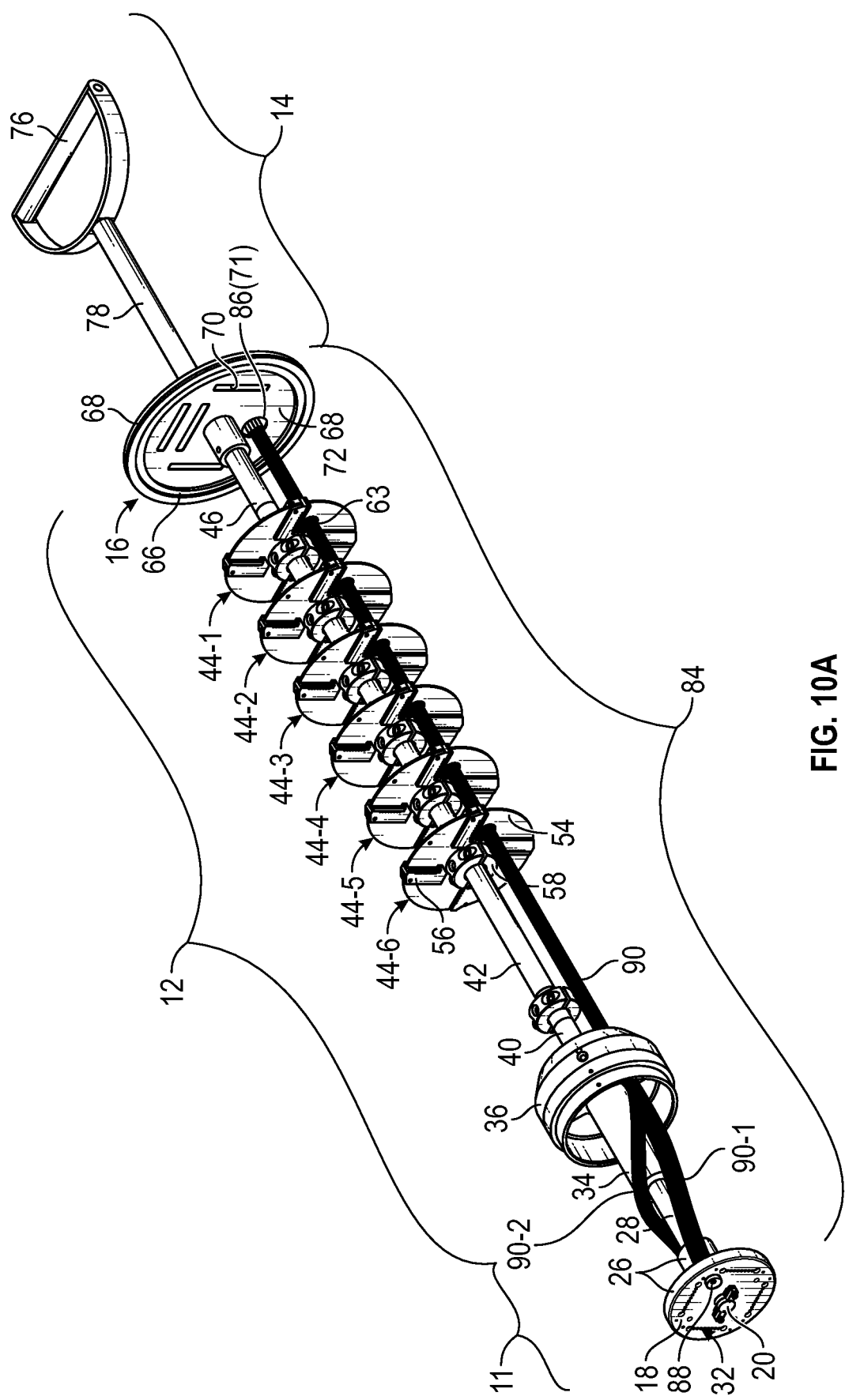
FIGS. 10A and 10B show details of a temperature control structure in the RF functional probe.
Figure 10B:
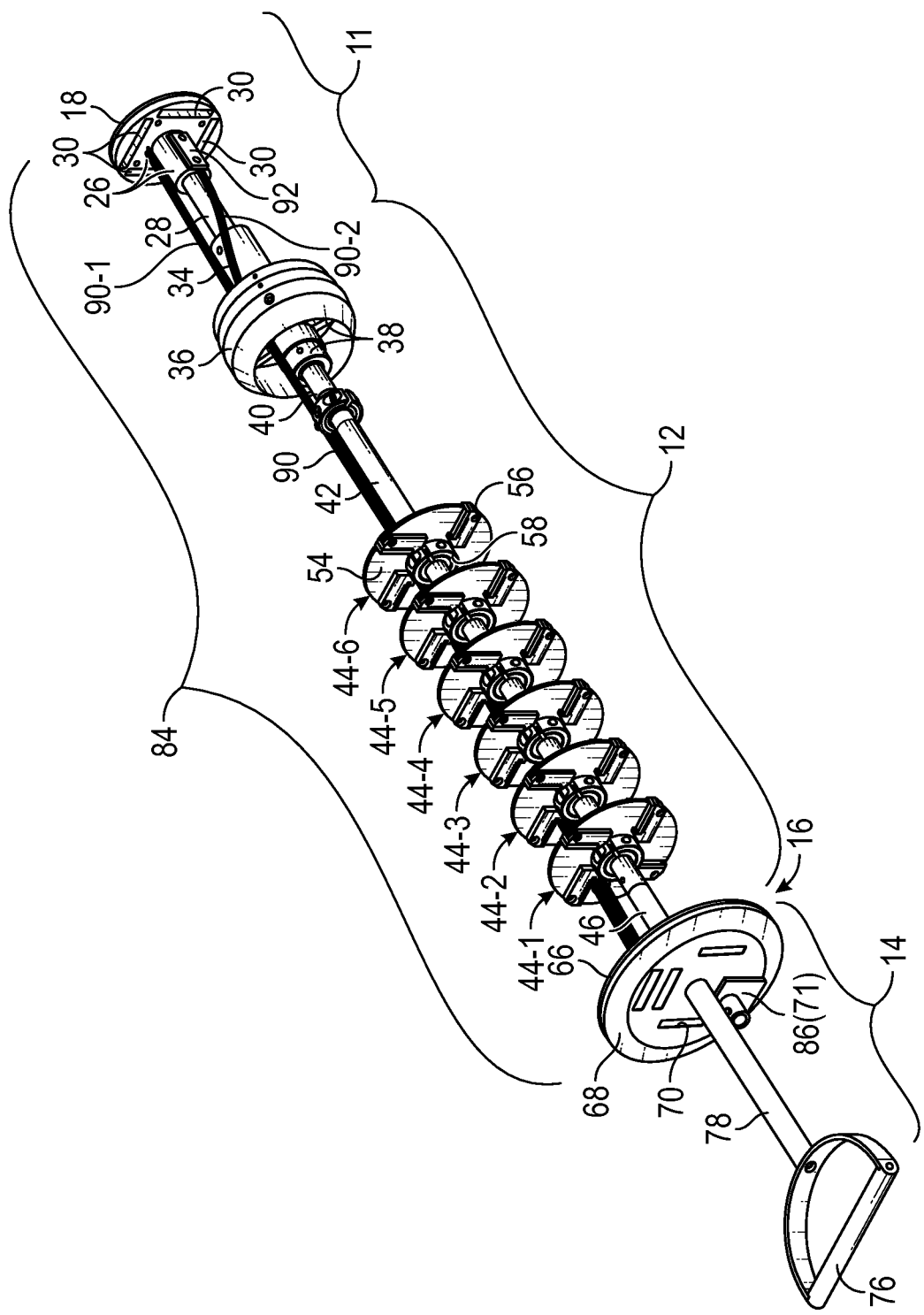

FIGS. 10A and 10B show details of an optional temperature control structure 84, which is configured to sense and change temperature of the RF device 20, in the RF functional probe 100. The temperature control structure 84 include a hermetic DC connector 86, a temperature sensor 88, a DC cable group 90, and a heater 92. The hermetic DC connector 86 extends through the flange hole 71 on the flange 68 and a portion of the hermetic DC connector 86 hermetically covers the flange hole 71. The temperature sensor 88 and the heater 92 are located at the probe head 11. The temperature sensor 88 is mounted to the PCB board 18 and located at a same side of the PCB 18 as the RF device 20. The temperature sensor 88 is configured to sense the temperature of the RF device 20. The heater 92 is mounted on the chuck 26 and located at a same side of the chuck 26 as the mount stud 28. The heater 92 is configured to change temperature to the PCB 18 and the RF device 20 (via the chuck 26). Note that the temperature sensor 88 is not permanently mounted to the PCB board 18, and the heater 92 is not permanently attached to the chuck 26. It is easy to replace the existing temperature sensor 88 with another temperature sensor and/or replace the existing heater 92 with another heater for different applications. The DC cable group 90 extends from the hermetic DC connector 86, through the side baffle hole 63 (only one side baffle hole is labeled with a reference number for clarity) on each baffle structure 44, through the shield ring 36, and toward the chuck 16. A first cable portion 90-1 of the DC cable group 90 is electrically coupled to the temperature sensor 88, and a second cable portion 90-2 of the DC cable group 90 is electrically coupled to the heater 92. As such, DC signals can be transferred between the temperature sensor 88 and the hermetic DC connector 86, and between the heater 92 and the hermetic DC connector 86.

In one embodiment, the hermetic DC connector 86 may be a ten-pin connector, where four pins are for the temperature sensor 88, two pins are for the heater 92, and the remaining four pins are reserved for extra component(s) if applicable. Accordingly, the DC cable group 90 includes ten cable wires, where the first cable portion 90-1 for the temperature sensor 88 includes four cable wires (each of which may be formed of quad twist Phosphor bronze), and the second cable portion 90-2 for the heater 92 includes two cable wires. Furthermore, the heater 92 may be mounted on the chuck 26 with two aluminum screws. In different applications, the hermetic DC connector 86 may have fewer or more pins, the DC cable group 90 may include fewer or more cable wires, the temperature sensor 88 may accommodate fewer or more cable wires, and the heater 92 may accommodate fewer or more cable wires. Herein, the heater 92 may be a ceramic heater that produces minimal to no magnetic field.

Figure 11:
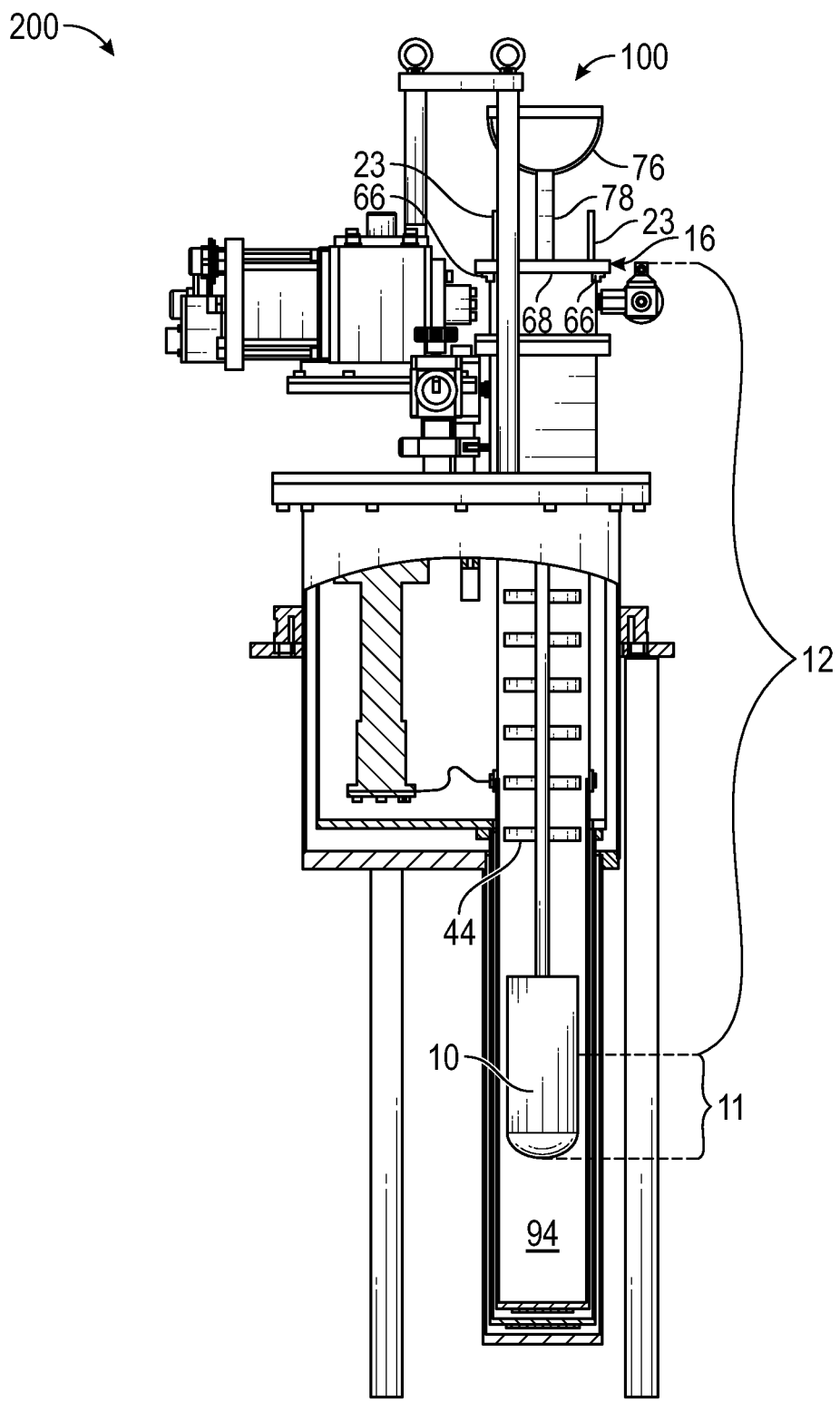
FIG. 11 shows an exemplary testing cryostat for the RF functional probe.

FIG. 11 shows an exemplary testing cryostat 200, which provides a cryogenic environment to the RF functional probe 100 for RF device testing (simplify the RF functional probe 100 for clarity). In the testing cryostat 200, low pressure helium is used to provide cryogenic temperature, e.g., 4.2K. Herein, the probe head 11 with the RF device 20 (covered by the magnetic shield 10), the isolation structure 12, and the RF cable structure 22 (not shown) of the RF functional probe 100 are inserted into a chamber 94 of the testing cryostat 200. The seal ring 66 of the flange structure 16 of the RF functional probe 100 is directly attached to an opening of the chamber 94. Recall that each flange notch 70 is hermetically covered by a corresponding hermetic RF connector 23, and the flange hole 71 is hermetically covered by the hermetic DC connector 86, such that a sealed cryogenic vacuum without helium loss can be formed by the chamber 94, the flange structure 16, and the hermetic RF connectors 23. Portions of the hermetic RF connectors 23 and the handle structure 14 are outside the chamber 94.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency (RF) functional probe for testing an RF device in a cryogenic environment comprising:
 a probe head configured to receive the RF device;
 a flange structure;
 an isolation structure coupled between the probe head and the flange structure, wherein the isolation structure includes a plurality of baffle structures, each of which includes cable guides; and
 an RF cable structure extending from the flange structure, through the isolation structure, and to the probe head, wherein:
  the RF cable structure is configured to transmit signals to and from the RF device;
  the isolation structure is configured to provide thermal and electrical isolation to reduce radiant heat leak from the RF cable structure to the RF device; and
  the cable guides of each of the plurality of baffle structures are configured to guide routing paths for the RF cable structure.

2. The RF functional probe of claim 1, wherein each of the plurality of baffle structures further comprises a baffle with baffle slots and a center baffle hole, wherein:
 the center baffle hole is located at a center of the baffle;
 each baffle slot extends from a periphery of the baffle towards the center baffle hole; and
 each baffle slot is configured to adapt a corresponding cable guide.

3. The RF functional probe of claim 2, wherein:
 the cable guides are formed of Teflon; and
 the baffle is formed of polished stainless steel.

4. The RF functional probe of claim 2, wherein each cable guide includes a plurality of separate guide holes that are aligned with a corresponding baffle slot.

5. The RF functional probe of claim 4, wherein the RF cable structure includes a plurality of RF cable groups, each of which includes a plurality of RF cable lines, wherein:
 each of the plurality of RF cable groups extends through a corresponding cable guide of each of the plurality of baffle structures; and
 each of the plurality of RF cable lines extends through a corresponding hole of the corresponding cable guide at each of the plurality of baffle structures.

6. The RF functional probe of claim 5 wherein each of the plurality of RF cable groups forms a different routing path through the plurality of baffle structures.

7. The RF functional probe of claim 2, wherein each of the plurality of baffle structures further comprises two baffle holders, which are put on opposite sides of one baffle to hold the baffle in place.

8. The RF functional probe of claim 2, wherein the isolation structure further comprises a Teflon isolator, a first G10 isolator, a support rod, and a second G10 isolator, wherein:
 the Teflon isolator is coupled between the probe head and the first G10 isolator;
 the support rod is coupled between the first G10 isolator and the second G10 isolator, and extends through each of the plurality of baffle structures via the center baffle hole of the baffle;
 the Teflon isolator, the first G10 isolator, and the second G10 isolator provide thermal and electrical isolation to reduce heat leak to the RF device; and
 the support rod is formed of stainless steel.

9. The RF functional probe of claim 8, wherein the isolation structure further comprises a shield ring and a shield mount within the shield ring, wherein:
 the shield mount includes a connection tube and a splitter coupled to the connection tube;
 the connection tube covers a junction of the Teflon isolator and the first G10 isolator; and
 the splitter includes a plurality of separation arms, which provide structural support to the shield ring and divide inner space of the shield ring into a plurality of equal portions.

10. The RF functional probe of claim 9, wherein the RF cable structure includes a plurality of RF cable groups, each of which includes a plurality of RF cable lines, wherein
 each of the plurality of RF cable groups extends from the flange structure, through each of the plurality of baffle structures, through a corresponding portion of the inner space of the shield ring, and toward the probe head.

11. The RF functional probe of claim 9 further comprising a magnetic shield, wherein:

the shield ring is configured to adapt the magnetic shield; and the magnetic shield fully covers the probe head, and partially covers the isolation structure.

12. The RF functional probe of claim 11 wherein:

the shield ring is formed of aluminum;

the shield mount is formed of aluminum; and the magnetic shield is formed of mu-metal.

13. The RF functional probe of claim 1, wherein the probe head includes a chuck and a mount stud inserted into the chuck, wherein:

a printed circuit board (PCB) is coupled to the chuck and located at an opposite side of the chuck to the mount stud;

the chuck is configured to receive the RF device through the PCB;

the chuck includes a plurality of chuck notches; and the chuck and the mount stud are formed of copper.

14. The RF functional probe of claim 13, wherein the flange structure includes a seal ring, a flange with a plurality of flange notches, and a flange mount ring, wherein:

the seal ring faces the isolation structure and is formed at a periphery of the flange; and the flange mount ring faces the isolation structure and is formed at a center of the flange to adapt to the isolation structure.

15. The RF functional probe of claim 14 wherein:

the chuck and the mount stud are formed of copper;

the seal ring is formed of buna or viton;

the flange mount ring is formed of aluminum; and the flange is formed of stainless steel.

16. The RF functional probe of claim 14, wherein the RF cable structure includes a plurality of RF cable groups, a plurality of cable connectors, and a plurality of hermetic RF connectors, wherein:

each of the plurality of RF cable groups includes a plurality of RF cable lines;

each of the plurality of cable connectors goes through a corresponding chuck notch;

each of the plurality of hermetic RF connectors goes through a corresponding flange notch, and hermetically seals the corresponding flange notch; and each of the plurality of RF cable groups extends from a corresponding hermetic RF connector, through each of the plurality of baffle structures, and to a corresponding cable connector.

17. The RF functional probe of claim 1, wherein the RF cable structure includes a plurality of RF cable groups, each of which includes a plurality of RF cable lines, wherein each of the plurality of RF cable groups forms a loop between two adjacent baffle structures of the plurality of baffle structures so as to absorb cable shrinkage due to temperature changes.

18. The RF functional probe of claim 1 further comprising a temperature control structure, which is configured to sense and change temperature of the RF device.

19. The RF functional probe of claim 18, wherein the temperature control structure includes a hermetic DC connector, a temperature sensor, a DC cable group, and a heater, wherein:

the hermetic DC connector extends through the flange structure via a flange hole, wherein a portion of the hermetic DC connector hermetically covers the flange hole;

the temperature sensor and the heater are located at the probe head;

the temperature sensor is configured to sense the temperature of the RF device, and the heater is configured to change the temperature of the RF device;

the DC cable group extends from the hermetic DC connector, along the isolation structure, and toward the temperature sensor and the heater.

20. The RF functional probe of claim 1 further comprising a handle structure with a handle and a handle mount bar, wherein:

the handle mount bar connects the handle to the flange structure; and the handle structure and the isolation structure are located at opposite sides of the flange structure.

* * * * *